(12) United States Patent
Briere

(10) Patent No.: US 8,988,133 B2
(45) Date of Patent: Mar. 24, 2015

(54) NESTED COMPOSITE SWITCH

(75) Inventor: Michael A. Briere, Scottsdale, AZ (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 13/542,194

(22) Filed: Jul. 5, 2012

(65) Prior Publication Data

US 2013/0015905 A1     Jan. 17, 2013

Related U.S. Application Data

(60) Provisional application No. 61/506,529, filed on Jul. 11, 2011.

(51) Int. Cl.
| H03K 17/687 | (2006.01) |
| H03K 17/567 | (2006.01) |
| H03K 17/10 | (2006.01) |
| H03K 17/16 | (2006.01) |
| H03K 17/30 | (2006.01) |
| H01L 21/8258 | (2006.01) |
| H01L 27/06 | (2006.01) |

(52) U.S. Cl.
CPC ............ *H03K 17/567* (2013.01); *H03K 17/107* (2013.01); *H03K 17/168* (2013.01); *H03K 17/302* (2013.01); *H01L 21/8258* (2013.01); *H01L 27/0605* (2013.01); *H01L 27/0629* (2013.01)
USPC ........... 327/434; 327/427; 327/429; 327/419; 327/420; 327/422

(58) Field of Classification Search
USPC .................................. 327/434, 420; 257/194
See application file for complete search history.

(56) References Cited

U.S. PATENT DOCUMENTS

| 6,483,369 | B1 * | 11/2002 | Wittenbreder, Jr. ............ 327/427 |
| 7,636,247 | B2 * | 12/2009 | Disney .......................... 363/21.1 |
| 2003/0122594 | A1 | 7/2003 | Tada |
| 2004/0124435 | A1 * | 7/2004 | D'Evelyn et al. ............. 257/103 |
| 2005/0006716 | A1 | 1/2005 | Kumar |
| 2008/0191216 | A1 * | 8/2008 | Machida et al. ................ 257/76 |
| 2009/0189191 | A1 | 7/2009 | Sato |
| 2009/0278513 | A1 | 11/2009 | Bahramian |
| 2010/0259186 | A1 | 10/2010 | Ernoux |
| 2012/0175634 | A1 * | 7/2012 | Weis .............................. 257/77 |
| 2013/0001648 | A1 | 1/2013 | He |
| 2013/0015501 | A1 | 1/2013 | Briere |
| 2013/0175542 | A1 | 7/2013 | Briere |

FOREIGN PATENT DOCUMENTS

JP     2006-351691     12/2006

OTHER PUBLICATIONS

Friedrichs, et. al.: "SIC Power Devices With Low On-Resistance for Fast Switching Applications" IEEE May 22, 2000, pp. 213-216.

* cited by examiner

*Primary Examiner* — Lincoln Donovan
*Assistant Examiner* — Patrick Chen
(74) *Attorney, Agent, or Firm* — Farjami & Farjami LLP

(57) ABSTRACT

There are disclosed herein various implementations of nested composite switches. In one implementation, a nested composite switch includes a normally ON primary transistor coupled to a composite switch. The composite switch includes a low voltage (LV) transistor cascoded with an intermediate transistor having a breakdown voltage greater than the LV transistor and less than the normally ON primary transistor. In one implementation, the normally on primary transistor may be a group III-V transistor and the LV transistor may be an LV group IV transistor.

27 Claims, 4 Drawing Sheets

NESTED COMPOSITE SWITCH

The present application claims the benefit of and priority to a provisional application entitled "Nested Composite Cascoded Device," Ser. No. 61/506,529 filed on Jul. 11, 2011. The disclosure in this provisional application is hereby incorporated fully by reference into the present application.

BACKGROUND

I. Definitions

As used herein, the phrase "group III-V" refers to a compound semiconductor that includes a group V element and at least one group III element. Moreover, the phrase "III-Nitride or III-N" refers to a compound semiconductor that includes nitrogen (N) and at least one group III element including aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), and aluminum indium gallium arsenide phosphide nitride ($Al_xIn_yGa_{(1-x-y)}As_aP_bN_{(1-a-b)}$), for example. III-Nitride also refers generally to any polarity including but not limited to Ga-polar, N-polar, semi-polar or non-polar crystal orientations. A III-Nitride material may also include either the Wurtzitic, Zincblende or mixed polytypes, and may include single-crystal, monocrystalline, polycrystalline, or amorphous structures.

Also as used herein, the phrase "group IV" refers to a semiconductor that includes at least one group four element including silicon (Si), germanium (Ge), and carbon (C), and also includes compound semiconductors such as SiGe and SiC, for example. Group IV may also refer to a semiconductor material which consists of layers of group IV elements or doping of group IV elements to produce strained silicon or other strained group IV material. In addition, group IV based composite substrates may include silicon on insulator (SOI), separation by implantation of oxygen (SIMOX) process substrates, and silicon on sapphire (SOS), for example. Moreover, a group IV device may include devices formed using standard CMOS processing, but may also include NMOS and PMOS device processing.

Furthermore, as used herein, the terms "LV device," "low voltage semiconductor device," "low voltage transistor, low voltage switch" and the like, refer to a low voltage device, with a typical breakdown voltage rating less than an "intermediate device," as described below. The LV device can include any suitable semiconductor material that forms a field-effect transistor (FET) such as an insulated-gate FET (IGFET), for example. Suitable semiconductor materials include group IV semiconductor materials such as Si, strained silicon, SiGe, SiC, and group III-V materials including III-As, III-P, III-Nitride or any of their alloys.

Additionally, the term "intermediate device, intermediate transistor and intermediate switch" refers to a device with a typical breakdown voltage greater than the LV device and less than a "primary device". The "primary device, primary transistor or primary switch" refers to a device with a typical breakdown voltage greater than both the intermediate device and the LV device.

II. Background Art

In high power and high performance switching applications, group III-V field-effect transistors (FETs) and high mobility electron transistors (HEMTs), such as III-Nitride FETs and III-Nitride HEMTs, are often desirable for their high efficiency and high-voltage operation. Moreover, it is often desirable to combine such group III-V transistors with other FETs, such as group IV FETs, to create high performance composite switches.

In power management applications where normally OFF characteristics of power devices are desirable, a depletion mode (normally ON) III-Nitride or other group III-V transistor can be cascoded with an enhancement mode (normally OFF) low-voltage (LV) group IV transistor, for example a silicon FET, to produce an enhancement mode (normally OFF) composite power switch. However, the performance of the composite switch can be limited by the on-state and voltage breakdown characteristics of the LV group IV transistor used. In particular, the breakdown voltage for a given on-state resistance of the LV group IV transistor may be insufficient to support the required pinch-off voltage required to maintain the group III-V transistor in a satisfactorily OFF condition.

SUMMARY

The present disclosure is directed to a nested composite switch, substantially as shown in and/or described in connection with at least one of the figures, and as set forth more completely in the claims.

DETAILED DESCRIPTION

Figure 1:
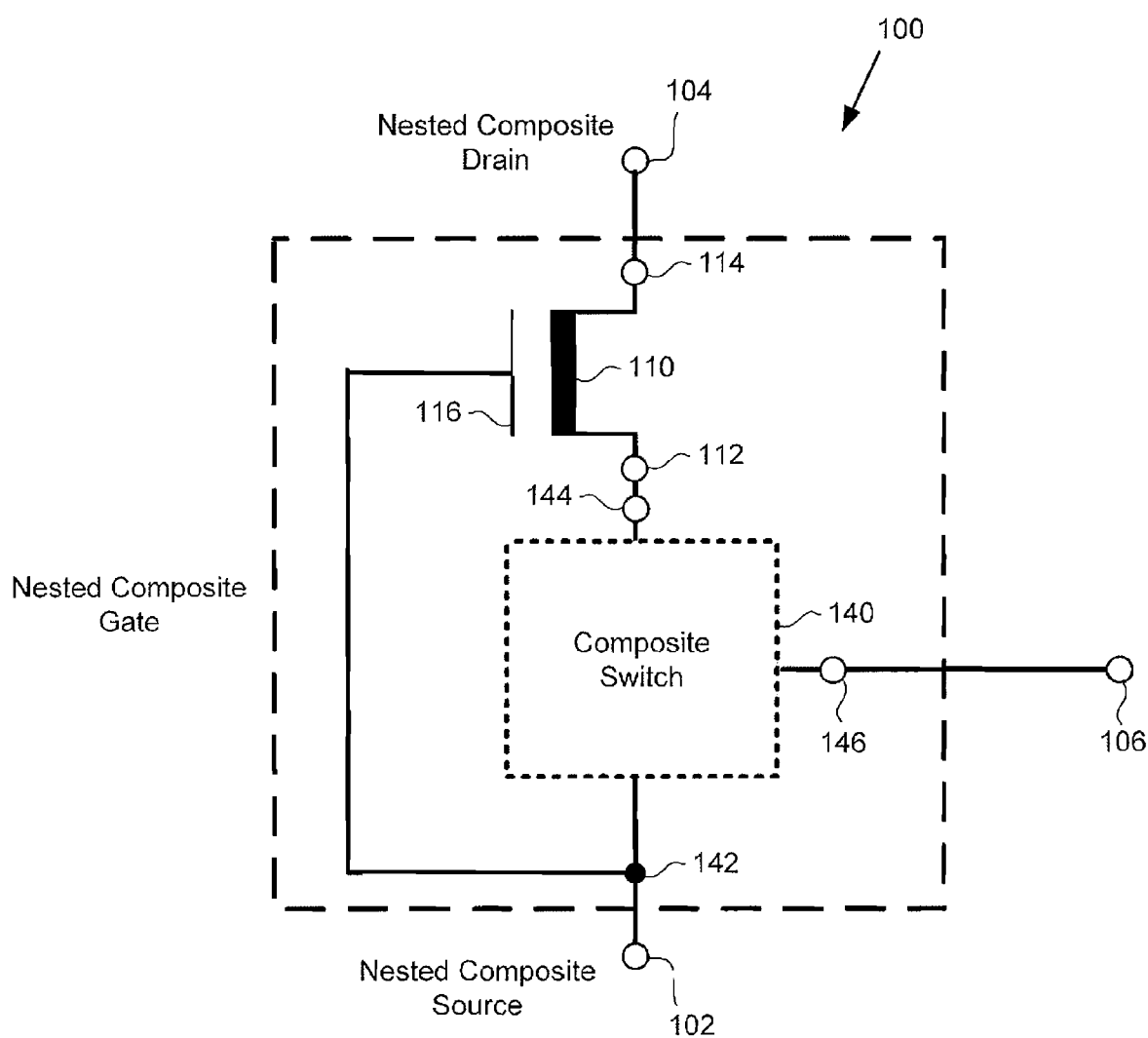
FIG. 1 presents a diagram showing one exemplary implementation of a nested composite switch including a primary transistor and a composite switch.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Group III-V semiconductors include III-Nitride materials formed of gallium nitride (GaN) and/or its alloys, such as aluminum gallium nitride (AlGaN), indium gallium nitride (InGaN), and aluminum indium gallium nitride (AlInGaN). These materials are semiconductor compounds that have a relatively wide, direct bandgap and strong piezoelectric polarizations, and can support high breakdown fields, high saturation velocities, and the creation of two-dimensional electron gases (2DEGs). As a result, III-Nitride materials such as GaN are used in many microelectronic applications such as depletion mode (e.g., normally ON) power field-effect transistors (FETs) and high electron mobility transistors (HEMTs).

As noted above, in power management applications where normally OFF characteristics of power devices are desirable, a depletion mode (normally ON) III-Nitride or other group III-V transistor can be cascoded with an enhancement mode (normally OFF) low voltage (LV) transistor, such as a silicon or other LV group IV transistor, to produce an enhancement mode composite power switch. However, the performance of the composite switch can be limited by the on-state and voltage breakdown characteristics of the LV group IV transistor used. In particular, the breakdown voltage for a given on-state resistance of the LV group IV transistor may be insufficient to support the required pinch-off voltage required to maintain the group III-V transistor in a satisfactorily OFF condition. In such a case, an intermediate III-V transistor may be used in a nested cascode configuration.

The present application is directed to a nested composite switch capable of providing enhanced voltage breakdown resistance while providing advantages such as fast switching speed, high transconductance, low switching charge, low threshold voltage, and low on-state resistance typically associated with an LV transistor.

According to one implementation, the nested composite switch includes a primary transistor coupled to a composite switch. The composite switch may include an LV transistor cascoded with an intermediate transistor (for example a depletion mode or normally ON III-N transistor) having a breakdown voltage greater than that that of the LV transistor and less than that of the primary transistor. Moreover, in one implementation, the composite switch including the LV transistor, which may be a normally OFF composite switch, can be cascoded with the primary transistor. The cascoded combination of the normally OFF composite switch with the primary transistor, which may be a normally ON III-Nitride or other group III-V device, for example, can be implemented to produce a normally OFF nested composite switch having an increased speed and breakdown voltage, and a reduced on-state resistance.

FIG. 1 shows one exemplary implementation of a nested composite switch including a primary transistor and a composite switch. As shown in FIG. 1, nested composite switch 100 includes primary transistor 110 and composite switch 140 coupled to primary transistor 110. As further shown in FIG. 1, nested composite switch 100 has nested composite source 102, nested composite drain 104, and nested composite gate 106. Also shown in FIG. 1 are source 112, drain 114, and gate 116 of primary transistor 110, and composite source 142, composite drain 144, and composite gate 146 of composite switch 140.

Figure 2:
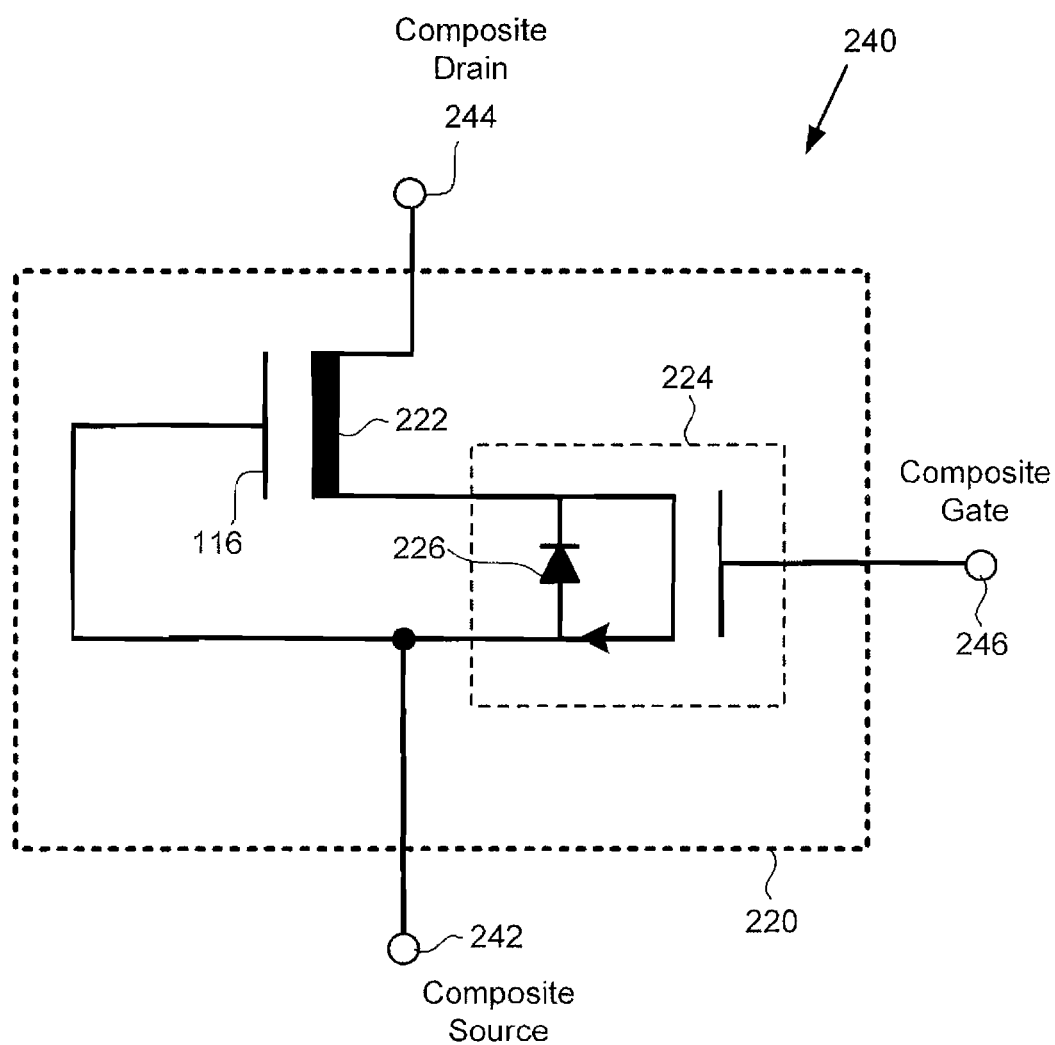
FIG. 2 presents a diagram showing a more detailed exemplary implementation of a composite switch suitable for use in a nested composite switch.

Referring now to FIG. 2, FIG. 2 shows a more detailed exemplary implementation of a composite switch suitable for use in a nested composite switch. As shown in FIG. 2, composite switch 240 includes intermediate transistor 222 and LV transistor 224 cascoded with intermediate transistor 222. As further shown in FIG. 2, LV transistor 224 includes body diode 226. Also shown in FIG. 2 are composite source 242, composite drain 244, and composite gate 246. Composite switch 240 having composite source 242, composite drain 244, and composite gate 246 corresponds to composite switch 140 having composite source 142, composite drain 144, and composite gate 146, in FIG. 1.

LV transistor 224 may be implemented as an LV group IV transistor, such as a silicon transistor having a breakdown voltage of approximately 10V or less, such as 3V, for example. According to one implementation, LV transistor 224 may be a silicon MOSFET, for example, including body diode 226.

Intermediate transistor 222 may be formed of III-N, and may be implemented as a HEMT or heterostructure FET (HFET), for example. According to one implementation, intermediate transistor 222 has a breakdown voltage greater than that of LV transistor 224 and less than that of primary transistor 110, in FIG. 1. More specifically, the breakdown voltage of intermediate transistor 222 is typically greater than the largest pinch-off voltage required to turn primary transistor 110 OFF.

Figure 3:
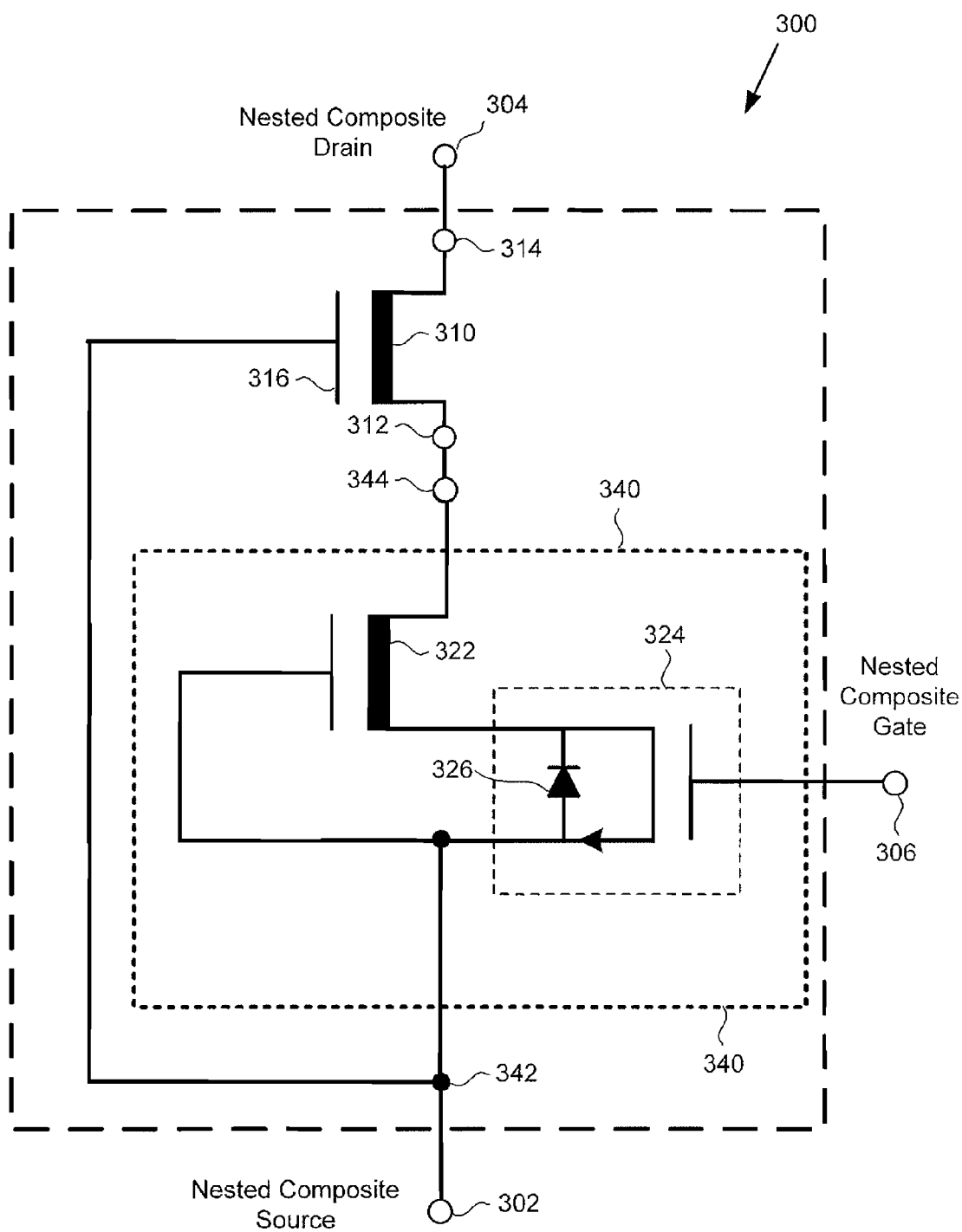
FIG. 3 presents a diagram showing an exemplary implementation of a nested composite switch including a primary transistor, and a composite switch corresponding generally to the implementation shown in FIG. 2.

FIG. 3 shows an exemplary implementation of a nested composite switch including a primary transistor, and a composite switch corresponding generally to the implementation shown in FIG. 2. Nested composite switch 300 includes primary transistor 310 coupled to composite switch 340. As shown in FIG. 3, composite switch 340 includes LV transistor 324 cascoded with intermediate transistor 322. As further shown in FIG. 3, LV transistor 324 includes body diode 326. Also shown in FIG. 3 are nested composite source 302, nested composite drain 304, and nested composite gate 306 of nested composite switch 300, as well as source 312, drain 314, and gate 316 of primary transistor 310, and composite source 342, composite drain 344, and composite gate 346 of composite switch 340.

Nested composite switch 300 having nested composite source 302, nested composite drain 304, and nested composite gate 306 corresponds to nested composite switch 100 having nested composite source 102, nested composite drain 104, and nested composite gate 106, and, in FIG. 1, and may share any of the characteristics previously attributed to those corresponding features, above. In addition, composite switch 340 having composite source 342, composite drain 344, and composite gate 346 corresponds to composite switch 240 having composite source 242, composite drain 244, and composite gate 246, in FIG. 2, and may share any of the characteristics previously attributed to those corresponding features.

Primary transistor 310 and composite switch 340 are coupled using a cascode configuration to produce nested composite switch 300, which according to the implementation shown in FIG. 3 results in a composite three terminal device. As a result, nested composite switch 300 can function in effect as a FET having nested composite source 302 and nested composite gate 306 provided by composite switch 340, and nested composite drain 304 provided by primary transistor 310. In other words, composite drain 344 of composite switch 340 is coupled to source 312 of primary transistor 310, composite source 342 of composite switch 340 provides nested composite source 302 for nested composite switch 300, and composite gate 346 of composite switch 340 provides nested composite gate 306 for nested composite switch 300. Moreover, drain 314 of primary transistor 310 provides nested composite drain 304 for nested composite switch 300, while gate 316 of primary transistor 310 is coupled to composite source 342 of composite switch 340.

The implementation shown in FIG. 3 advantageously provides nested composite switch 300 having increased switching speed and reduced on-state resistance when compared to conventional power devices with comparable voltage standoff capability. In some implementations, it may be advantageous to nest another high voltage or primary transistor with the nested composite switch shown in FIG. 3. An exemplary implementation of such a multi-nested composite switch is shown in FIG. 4.

Multi-nested composite switch 401 includes higher voltage (HV+) primary transistor 411 coupled to nested composite switch 400. Nested composite switch 400 includes primary transistor 410 coupled to composite switch 440, and corresponds to nested composite switch 300 including primary transistor 310 coupled to composite switch 340, in FIG. 3. As used herein, "HV+ primary transistor" refers to a primary transistor having a breakdown voltage equal to or greater than the breakdown voltage of primary transistor 410.

Figure 4:
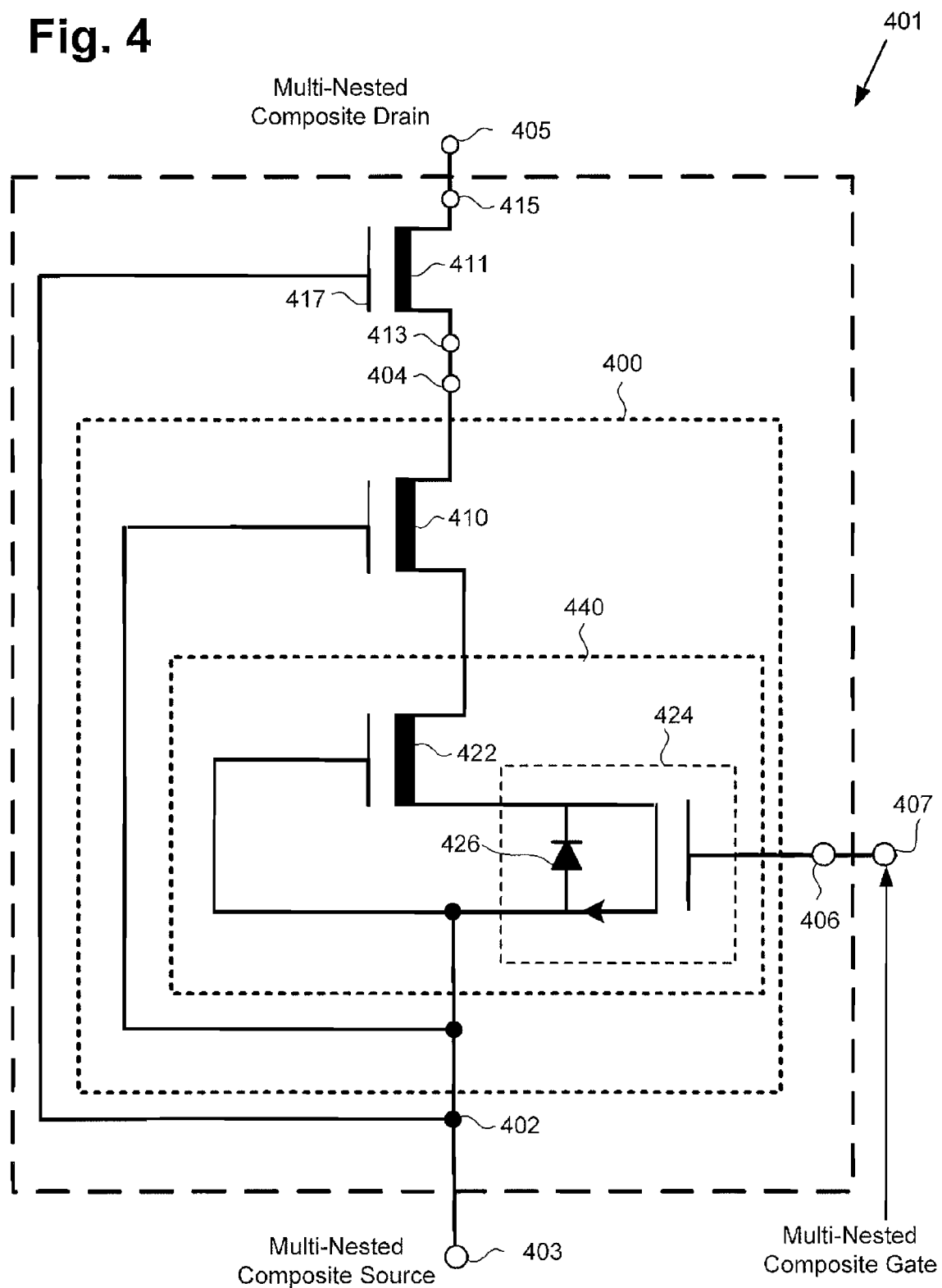
FIG. 4 presents a diagram showing an exemplary implementation of a multi-nested composite switch.

According to the implementation shown in FIG. 4, HV+ primary transistor 411 and nested composite switch 400 are coupled using a cascode configuration to produce multi-nested composite switch 401. That is to say, nested composite drain 404 of nested composite switch 400 is coupled to source 413 of HV+ primary transistor 411, nested composite source 402 of nested composite switch 400 provides multi-nested composite source 403 for multi-nested composite switch 401, and nested composite gate 406 of nested composite switch 400 provides multi-nested composite gate 407 for multi-nested composite switch 401. Moreover, drain 415 of HV+ primary transistor 411 provides multi-nested composite drain 405 for multi-nested composite switch 401, while gate 417 of HV+ primary transistor 411 is coupled to nested composite source 402 of nested composite switch 400.

The implementation shown in FIG. 4 advantageously provides fast switching speed and low switching resistance analogous to the implementation in FIG. 3, while producing a higher breakdown voltage. In yet other implementations, it may be desirable to repeat this nesting of cascoded composite switches including one normally OFF LV group IV transistor and several normally ON group III-V transistors to produce a normally OFF multi-nested composite switch capable of very high voltage operation.

In some implementations, it may further be desirable to reduce package parasitics, such as package inductances of the nested or multi-nested composite switch. Referring back to FIG. 3, for example, one possible solution for reducing package parasitics for nested composite switch 300 is through monolithic integration of primary transistor 310 and/or composite switch 340. In other words, primary transistor 310, intermediate transistor 322, and LV transistor 324 may be monolithically integrated on a common composite semiconductor substrate designed to support both group IV and group III-V device fabrication.

Thus, by coupling a primary transistor to a composite switch including an LV transistor cascoded with an intermediate transistor, the present application discloses a nested composite switch having increased breakdown voltage. Moreover, when implemented so as to use the LV transistor to control current through the primary transistor, the implementations disclosed herein provide a nested switch having increased speed and reduced switching resistance when compared to conventional high voltage switches. The addition of an intermediate switch allows the use of a low voltage switch that would not otherwise be capable of adequately maintaining the primary switch in an OFF state within a cascode configuration.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A nested composite switch comprising:
a normally ON primary transistor coupled to a composite switch;
said composite switch including a normally OFF low voltage (LV) transistor cascoded with a normally ON intermediate transistor having a breakdown voltage greater than said normally OFF LV transistor and less than said normally ON primary transistor;
said breakdown voltage of said normally ON intermediate transistor being greater than a pinch-off voltage required to turn said normally ON primary transistor OFF;
said normally ON primary and intermediate transistors being depletion mode transistors, and said normally OFF LV transistor being an enhancement mode transistor.

2. The nested composite switch of claim 1, wherein said normally ON primary transistor is a group III-V transistor.

3. The nested composite switch of claim 1, wherein said normally ON primary transistor is one of a III-Nitride heterostructure field-effect transistor (HFET) and a high electron mobility transistor (HEMT).

4. The nested composite switch of claim 1, wherein said composite switch is a normally OFF composite switch.

5. The nested composite switch of claim 1, wherein said normally OFF LV transistor is a normally OFF LV group IV transistor.

6. The nested composite switch of claim 1, wherein said nested composite switch is normally OFF.

7. The nested composite switch of claim 1, wherein said nested composite switch is monolithically integrated.

8. The nested composite switch of claim 1, wherein at least two of said normally ON primary transistor, said normally ON intermediate transistor, and said normally OFF LV transistor are monolithically integrated.

9. The nested composite switch of claim 1, wherein a composite drain of said composite switch is coupled to a source of said normally ON primary transistor, a composite source of said composite switch provides a nested composite source for said nested composite switch, and a composite gate of said composite switch provides a nested composite gate for said nested composite switch;
a drain of said normally ON primary transistor provides a nested composite drain for said nested composite switch, and a gate of said normally ON primary transistor is coupled to said composite source of said composite switch.

10. The nested composite switch of claim 1, wherein said nested composite switch is cascoded with at least one higher voltage (HV+) primary transistor.

11. A nested composite switch comprising:
a normally ON primary transistor coupled to a normally OFF composite switch;
said normally OFF composite switch including a normally OFF low voltage (LV) transistor cascoded with a normally ON intermediate transistor having a breakdown voltage greater than said normally OFF LV transistor and less than said normally ON primary transistor;
said breakdown voltage of said normally ON intermediate transistor being greater than a pinch-off voltage required to turn said normally ON primary transistor OFF;
said normally ON primary and intermediate transistors being depletion mode transistors, and said normally OFF LV transistor being an enhancement mode transistor.

12. The nested composite switch of claim 11, wherein said normally ON primary transistor is a normally ON group III-V transistor.

13. The nested composite switch of claim 11, wherein said normally ON primary transistor is one of a Ill-Nitride heterostructure field-effect transistor (HFET) and a high electron mobility transistor (HEMT).

14. The nested composite switch of claim 11, wherein said normally OFF LV transistor is a normally OFF LV group IV transistor.

15. The nested composite switch of claim 11, wherein said nested composite switch is normally OFF.

16. The nested composite switch of claim 11, wherein a composite drain of said normally OFF composite switch is coupled to a source of said normally ON primary transistor, a composite source of said normally OFF composite switch provides a nested composite source for said nested composite switch, and a composite gate of said normally OFF composite switch provides a nested composite gate for said nested composite switch;

a drain of said normally ON primary transistor provides a nested composite drain for said nested composite switch, and a gate of said normally ON primary transistor is coupled to said composite source of said normally OFF composite switch.

17. The nested composite switch of claim 11, wherein said nested composite switch is monolithically integrated.

18. The nested composite switch of claim 11, wherein at least two of said normally ON primary transistor, said normally ON intermediate transistor, and said normally OFF LV transistor are monolithically integrated.

19. The nested composite switch of claim 11, wherein said nested composite switch is cascoded with at least one higher voltage (HV+) primary transistor.

20. A nested composite switch comprising:
a normally ON primary group III-V transistor coupled to a composite switch;
said composite switch including a normally OFF low voltage (LV) group IV transistor cascoded with a normally ON intermediate group III-V transistor having a breakdown voltage greater than said normally OFF LV group IV transistor and less than said normally ON primary group III-V transistor;
said breakdown voltage of said normally ON intermediate group III-V transistor being greater than a pinch-off voltage required to turn said normally ON primary group III-V transistor OFF;
said normally ON primary and intermediate group III-V transistors being depletion mode transistors, and said normally OFF LV group IV transistor being an enhancement mode transistor.

21. The nested composite switch of claim 20, wherein said normally ON primary group III-V transistor is one of a III-Nitride heterostructure field-effect transistor (HFET) and a high electron mobility transistor (HEMT).

22. The nested composite switch of claim 20, wherein said composite switch is a normally OFF composite switch.

23. The nested composite switch of claim 20, wherein said nested composite switch is normally OFF.

24. The nested composite switch of claim 20, wherein a composite drain of said composite switch is coupled to a source of said normally ON primary group III-V transistor, a composite source of said composite switch provides a nested composite source for said nested composite switch, and a composite gate of said composite switch provides a nested composite gate for said nested composite switch;

a drain of said normally ON primary group III-V transistor provides a nested composite drain for said nested composite switch, and a gate of said normally ON primary group III-V transistor is coupled to said composite source of said composite switch.

25. The nested composite switch of claim 20, wherein said nested composite switch is monolithically integrated.

26. The nested composite switch of claim 20, wherein at least two of said normally ON primary group III-V transistor, said normally ON intermediate group III-V transistor, and said normally OFF LV group CV transistor are monolithically integrated.

27. The nested composite switch of claim 20, wherein said nested composite switch is cascoded with at least one higher voltage (HV+) primary transistor.

\* \* \* \* \*